United States Patent
Buer et al.

[11] Patent Number: 6,052,559
[45] Date of Patent: Apr. 18, 2000

[54] THERMOELECTRICALLY COOLED LOW NOISE AMPLIFIER AND METHOD

[75] Inventors: Kenneth Vern Buer; David Warren Corman, both of Gilbert; Richard Scott Torkington, Mesa, all of Ariz.

[73] Assignee: Motorola, Inc., Schaumburg, Ill.

[21] Appl. No.: 08/850,540

[22] Filed: May 2, 1997

[51] Int. Cl.[7] ............................ H04Q 7/20
[52] U.S. Cl. ............ 455/12.1; 455/341; 455/13.4; 455/343; 455/347
[58] Field of Search ............... 455/427, 12.1, 455/13.4, 347, 349, 128, 351, 217, 341, 431, 343

[56] References Cited

U.S. PATENT DOCUMENTS

| | | | |
|---|---|---|---|
| 4,215,327 | 7/1980 | McCrea | 333/252 |
| 4,567,767 | 2/1986 | Quate et al. | 73/606 |
| 4,935,864 | 6/1990 | Schmidt et al. | 363/141 |
| 5,032,897 | 7/1991 | Mansuria et al. | 357/80 |
| 5,157,352 | 10/1992 | Chickanosky, Jr. et al. | 330/289 |
| 5,475,317 | 12/1995 | Smith | 324/760 |
| 5,569,950 | 10/1996 | Lewis et al. | 257/469 |
| 5,590,395 | 12/1996 | Diekelman | 455/13.1 |
| 5,604,925 | 2/1997 | O'Malley et al. | 455/254 |
| 5,640,386 | 6/1997 | Wiedeman | 455/12.1 |
| 5,652,763 | 7/1997 | Delfyett, Jr. | 372/107 |
| 5,704,213 | 1/1998 | Smith et al. | 62/3.7 |
| 5,768,684 | 6/1998 | Grubb et al. | 455/13.4 |
| 5,793,419 | 8/1998 | Fraley | 348/143 |

*Primary Examiner*—Daniel S. Hunter
*Assistant Examiner*—Yemane Woldetatios
*Attorney, Agent, or Firm*—Gregory J. Gorrie

[57] ABSTRACT

A space-based communication system (30), includes a transmission terminal having a transmission antenna (42) and a power amplifier (40) to power the transmission antenna, the power amplifier to generate a power output sufficient to generate an RF signal through the transmission antenna (42), a receive terminal including a receive antenna (45) to receive the RF signal from the transmission terminal and a low noise amplifier (43) to amplify the RF signal channeled through the receive antenna, and a thermoelectric cooler (62) for cooling the low noise amplifier (43) to a predetermined temperature for increasing the sensitivity of the low noise amplifier to minimize the power output generated by the power amplifier required to generate the RF signal thereby minimizing the overall power requirements of the spaced-based communication system (30).

8 Claims, 1 Drawing Sheet

THERMOELECTRICALLY COOLED LOW NOISE AMPLIFIER AND METHOD

FIELD OF THE INVENTION

This invention relates generally to the field of space-based communication systems and, more particularly, to a thermoelectrically cooled low noise amplifier for space-based communication applications.

BACKGROUND OF THE INVENTION

In space-based crosslinks, microwave communication links must be highly efficient on both the transmit and the receive end of the link. This is a different problem from traditional satellite-to-ground communication links. In these traditional communication systems, the ground-based side of the link is not limited in terms of antenna size, weight and power consumption. The traditional systems, therefore, have the freedom to design microwave communication links that provide high efficiency, small size and low weight on the space-based end of the link while making up for the performance shortcomings on the ground side of the link. For example, spacecraft antennas are kept small to minimize weight, while ground antennas are usually large with very high antenna gain. Also, microwave power amplifiers on board spacecraft are usually minimized since additional antenna gain on the ground can compensate for lower transmit power. In the same way, additional transmit power from the ground is much easier to generate since it does not need to be highly efficient. In satellite-to-satellite crosslink communication systems, both ends of the link are space-based. Therefore, the overall direct current (DC) power efficiency of the link must be maximized.

In a space-based microwave crosslink system, the major microwave components which comprise the link and thus define overall link efficiency are the transmit and receive antennas, the transmit power amplifier and the receiver low noise amplifier. In order to improve link performance without impacting power consumption, antenna gain can be increased by providing a larger aperture antenna. However, since both ends of the link are space-based, there is a practical limit to the maximum antenna size due to typical satellite size and weight constraints. Also, higher antenna gain requires better pointing accuracy and more stable platforms in order for the link to acquire. Since both ends of a crosslink are mobile, this further limits maximum antenna gain. With the above fundamental limitations, there are no straight-forward improvements to antenna gain that can solve the overall efficiency problem.

Incremental improvements in device technology, circuit topology, and communication system implementation have improved microwave power amplifier efficiency. Even with these improvements, power amplifiers remain the largest power consumption component in microwave communication systems. As a result, power amplifiers are the focus of most efficiency improvement effort. The primary objective is, in general, to provide the required radio frequency (RF) output power with the least amount of DC power output.

In order to provide a crosslink system with minimum RF output power from the power amplifier, the low noise amplifier (LNA) must be improved. One method of improving noise figure is by utilizing better device technology such as InP devices or very short gate lengths (<0.1 $\mu$m). However, this technology is very expensive and provides only incremental improvement in noise figure performance. Another way of improving noise figure is by cooling the LNA receiver. It is known that noise figure for a given LNA improves at a rate of approximately 0.015 dB per degree Celsius as the operating temperature of the amplifier is reduced. However, most cooling systems are large, heavy and unsuitable for use in space-based communication systems.

Therefore, what is needed is a highly efficient space-based microwave crosslink communication system in which both ends of the crosslink are optimized in terms of size, weight and power consumption. What is also needed is an efficient method of cooling an LNA suitable for use in a space-based crosslink communication system. Further needed is an integrated packaging approach which allows efficient localized cooling of the LNA for improved performance without requiring excessive cooling power.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

The exemplification set out herein illustrates a preferred embodiment of the invention in one form thereof, and such exemplification is not intended to be construed as limiting in any manner.

DETAILED DESCRIPTION OF THE DRAWINGS

The present invention provides, among other things, a method for reducing the overall DC power consumption in a space-based crosslink communication system, and a space-based crosslink communication system utilizing a thermoelectrically cooled LNA apparatus operative for reducing the total DC power output in the space-based crosslink communication system.

Figure 1:
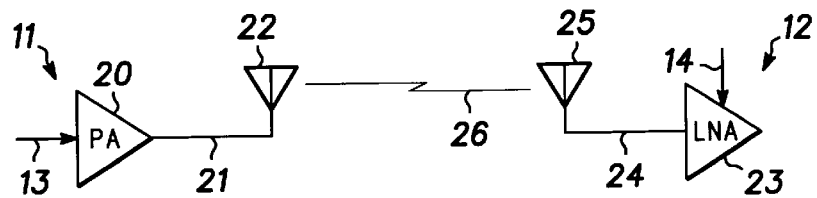
FIG. 1 illustrates a prior art space-based crosslink microwave communication system.

FIG. 1 illustrates a prior art space-based crosslink microwave communication system. Regarding FIG. 1, illustrated is a prior art representation of a space-based crosslink microwave communication system generally represented by the reference character 10. Communication system 10 includes a first space-based station 11 and a second spaced-based station 12. Like conventional space-based communication systems, first space-based station 11 and second space-based station 12 are each normally provided as satellites or other similar earth-orbiting vehicle. In this regard, each satellite may be either synchronous or geosynchronous, and may further reside in high, medium or low orbital configurations. In order to maintain a communication pathway or crosslink, communication system 10 must include at least one transmission terminal for generating and transmitting RF communication signals and at least one receive terminal for receiving RF communication signals transmitted from the transmission terminal. Accordingly, it is contemplated that first space-based station 11 and second spaced-based station 12 each include not only RF signal transmission capabilities, but also RF signal receiving capabilities, of which is typical of conventional spaced-based communication systems in general. In this manner, RF signal transmission and receipt would generally be employed in both directions using time-domain or frequency-division multiplexing to separate the transmit and receive signals from self-interference. However, to facilitate ease of discussion, it will be generally understood that first space-based station 11 includes a transmission terminal 13, a second space-based station 12 includes a receive terminal 14.

Like conventional space-based transmission terminals, transmission terminal 13 includes a power amplifier 20 electrically coupled via electrical interconnection 21 to a transmit antenna 22. In similar fashion, receive terminal 14 includes a receiver LNA 23 electrically coupled via electrical interconnection 24 to a receive antenna 25. Power amplifier 20 is of a conventional variety well known to those having regard toward the art and operative for generating and supplying a predetermined amount of RF power to transmit antenna 22 via electrical interconnection 21. Transmit antenna 22 is correspondingly operative for transmitting an RF signal via communication pathway 26 for receipt by receive terminal 14. Power amplifier 20 generates a predetermined RF power output suitable for transmitting the RF via transmit antenna 22 to receive terminal 14, of which generally corresponds to the amount of DC power supplied to power amplifier 20. In like manner, receiver LNA 23 is also of a conventional variety well known to those having regard toward the art and suitably operative for amplifying the RF signal received thereby from receive antenna 25 via electrical interconnection 24.

The total DC power consumption of communication system 10 is primarily dominated by the amount of DC power consumed by power amplifier 20. The amount of DC power consumed by power amplifier 20 is nevertheless generally dependent upon the noise figure of receiver LNA 23. Typically, the noise figure for receiver LNA 23, which is related to the sensitivity of receiver LNA 23, is approximately 3 dB. Thus, in this specific example during normal operation, and based on receiver LNA 23 having a noise figure of 3 dB, the total power consumption of communication system 10 is approximately 60 Watts based on a 25 percent power added system efficiency. This power requirement is necessary in order to desirably sustain communication pathway 26.

The 60 Watt total power consumption of communication system 10 is considerable. Because the total power output of communication system 10 is generally dependent upon the noise figure of receiver LNA 23, the present invention provides a more sensitive receiver LNA operative for reducing the total power consumption of the power amplifier to a minimum value thus reducing and conserving DC power and improving the overall efficiency of a space-based crosslink microwave communication system.

It is generally understood that the noise figure for a given LNA improves at a rate of approximately 0.015 dB per degree Celsius as the operating temperature of the LNA is reduced. In this regard, the present invention utilizes a thermoelectric cooler to provide highly localized and efficient cooling of the receiver LNA in a space-based crosslink microwave communication system operative for minimizing the power consumed by the power amplifier in the transmission terminal.

Figure 2:
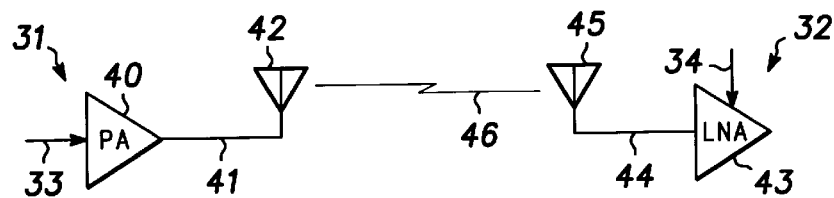
FIG. 2 illustrates a space-based crosslink microwave communication system utilizing a thermoelectrically cooled low noise amplifier, in accordance with a preferred embodiment of the present invention.

FIG. 2 illustrates a space-based crosslink microwave communication system utilizing a thermoelectrically cooled low noise amplifier, in accordance with a preferred embodiment of the present invention. The communication system utilizing thermoelectrically cooled low noise amplifier is generally designated by the reference character 30. In general similarity to communication system 10 discussed in combination with FIG. 1, communication system 30 includes a first space-based station 31 and a second spaced-based station 32. First spaced-based station 31 and second spaced-based station 32 may each comprise a satellite or other similar earth-orbiting vehicle. In this regard, each satellite may be either synchronous or geosynchronous, and may further reside in high, medium or low orbital configurations. In order to maintain a communication pathway or crosslink, communication system 30 includes at least one transmission terminal for generating and transmitting RF communication signals and at least one receive terminal for receiving RF communication signals transmitted from the transmission terminal. Therefore, it is contemplated that first space-based station 31 and second spaced-based station 32 each include not only RF signal transmission capabilities, but also RF signal receiving capabilities. In this manner, RF signal transmission and receipt would generally be employed in both directions using time-domain or frequency-division multiplexing to separate the transmit and receive signals from self-interference. However, to facilitate ease of discussion, it will be generally understood that first spaced-based station 31 includes a transmission terminal 33, and second space-based station 32 includes a receive terminal 34.

Transmission terminal 33 includes a power amplifier 40 electrically coupled via electrical interconnection 41 to a transmit antenna 42. In similar fashion, receive terminal 34 includes a receiver LNA 43 electrically coupled via electrical interconnection 44 to a receive antenna 45. Power amplifier 20 is of a conventional variety well known to those having regard toward the art and operative for generating and supplying a predetermined amount of RF power operative to transmit antenna 42 via electrical interconnection 41. Transmit antenna 42 is correspondingly operative for transmitting an RF signal via communication pathway 46 for receipt by receive terminal 34. Power amplifier 40 generates a predetermined RF power output suitable for transmitting the RF via transmit antenna 42 to receive terminal 34, of which generally corresponds to the amount of DC power supplied to power amplifier 40. In like manner, receiver LNA 43 is desirably operative for amplifying the RF signal received thereby from receive antenna 45 via electrical interconnection 44.

Figure 3:
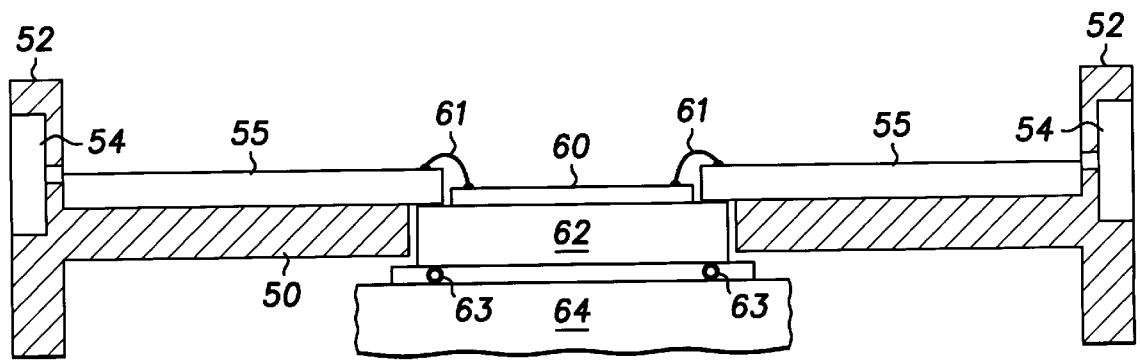
FIG. 3 illustrates a packaged thermoelectrically cooled low noise amplifier, in accordance with a preferred embodiment of the present invention.

FIG. 3 illustrates a packaged thermoelectrically cooled low noise amplifier, in accordance with a preferred embodiment of the present invention. Receiver LNA 43 is packaged and thermoelectrically cooled by virtue of a thermoelectric cooler. In this regard, receiver LNA 43 includes a base or housing 50 having an upstream end 51 and a downstream end 52, each of which carry an RF connector, 53 and 54, respectively operative for communicating RF signal transmissions. Housing may be constructed of any suitable material such as a selected metal or other similar substance suitable for spaced-based communication operations. Carried by and overlying portions of housing 50 intermediate upstream end 51 and downstream end 52 is an RF board or interconnect substrate 55 electrically coupled to RF connectors 53 and 54. Further provided is a monolithic microwave integrated circuit (MMIC) 60 carried proximate interconnect substrate 55 at a location generally intermediate upstream end 51 and downstream end 52 of housing 50. MMIC 60 is electrically interconnected to interconnect substrate 55 by virtue of electrical interconnections 61 operative for electrically interconnecting RF connector 53 to RF connector 54. Carried by housing 50 at a location underlying MMIC 60 is a thermoelectric cooler 62. Thermoelectric cooler 62 is localized at a position proximate MMIC 60 such that MMIC will rest directly upon and engage thermoelectric cooler 62. Thermoelectric cooler 62 includes terminals 63 which lead to a DC power source (not shown) operative for providing DC power to thermoelectric cooler 62.

It will be readily understood by those skilled in the art that although a single receiver LNA 43 has been herein discussed, receive terminal 34 may include a plurality of such devices having similar functional and structural characteristics. Furthermore, and consistent with the teachings of the instant invention, thermoelectric coolers and monolithic microwave integrated circuits are conventional devices well known by the skilled artisan. As a result, the specific structural and functional attributes of the thermoelectric cooler 62 and MMIC 60 will not be herein specifically addressed as they will readily occur to the skilled artisan.

From the foregoing description of the various elements of receiver LNA 43, it will be generally understood that RF signals received by receiver antenna 45 admit through RF connector 53 at upstream end 51, conduct through interconnect substrate 55, become amplified through MMIC 60, and then pass through interconnect substrate 55 and admit through RF connector 54 at downstream end 52 of housing 50. Furthermore, and like communication system 10 previously discussed, the total DC power consumption of communication system 30 is primarily dominated by amount of DC power consumed by power amplifier 40. The amount of DC power consumed by power amplifier 40 is nevertheless generally dependent upon the noise figure of receiver LNA 43. The noise figure of receiver LNA 43 is dramatically and desirably reduced by virtue of thermoelectric cooler 62, thus increasing the sensitivity of receiver LNA 43 and reducing the total amount of DC power required by power amplifier 40 in order to sustain a communication pathway 46 between transmission terminal 33 and receive terminal 34.

Thus, during operation thermoelectric cooler 62 provides a direct and localized cooling environment for directly cooling only MMIC 60 thereby inhibiting the operating temperature of MMIC 60 from exceeding a predetermined temperature level. As a result of the direct and localized cooling of MMIC 60, thermoelectric cooler 62 is correspondingly small and exceedingly light. Consistent with the teachings of the preferred embodiment, thermoelectric cooler 62 provides approximately 60 degrees Celsius of cooling to MMIC 60. Thus, in view of the example described previously, due to the direct and localized cooling of MMIC 60 on the order of approximately 60 degrees Celsius, the noise figure of MMIC 60 is maintained at 2 dB, 1 dB lower than conventional LNA apparatus, thereby allowing the DC output power provided by power amplifier 40 to be correspondingly dropped 1 dB. With a 1 dB lower RF power output, the operating temperature of power amplifier 40 also decreases thereby resulting in more efficient operation of power amplifier 40.

The DC power output necessary to operate thermoelectric cooler 62 amounts to 2 Watts of DC power. However, due to the 1 dB reduction in required RF output power and more efficient operation of the power amplifier 40 resulting from the 1 dB improved noise figure at receiver LNA 43 contributing to greater sensitivity at the receive terminal 34, the DC power required by power amplifier 40 amounts to only 44 Watts. Therefore, although the prior art communication system 10 discussed in combination with FIG. 1 includes a total power consumption of 60 Watts of DC power, the total power consumption of communication system 30 includes the sum of the 2 Watts of DC power required to operate thermoelectric cooler 62, and the 44 Watts of DC power required from power amplifier 40, which totals 46 Watts of DC power. Thus, as a specific example, from 60 Watts of DC power consumed by the prior art communication system 10, the packaged and thermoelectrically cooled nature of receiver LNA 43 results in a total DC power consumption of communication system 30 of 46 Watts of DC power, an improvement of 14 Watts of DC power over the prior art communication system 10.

In summary, the present invention provides a new and improved spaced-based crosslink communication system in which the transmit side and the receive side of the crosslink are optimized in terms of size, weight and power consumption, and a new and improved method for increasing the efficiency of a spaced-based communication while conserving utilities in the form of total overall communication system DC power consumption. Utilizing a thermoelectrically cooled LNA accomplishes these tasks. Regarding a preferred embodiment, each individual MMIC is desirably cooled by an individual thermoelectric cooler thus provided efficient and direct cooling while maintaining a sufficiently small and light RF signal receiver. As a consequence of the direct and localized cooling of the MMIC apparatus, the overall sensitivity of the receiver LNA increases thereby minimizing the total overall DC power consumption of the communication system. In a preferred embodiment, thermoelectric cooler 62 is coupled to heat spreader 64.

The present invention has been described above with reference to a preferred embodiment. However, those skilled in the art will recognize that changes and modifications may be made in the described embodiments without departing from the nature and scope of the present invention. Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

What is claimed is:

1. A method of reducing the overall power consumption in a spaced-based microwave communication system, said method comprising the steps of:

providing in a first satellite a transmission terminal including a transmission antenna powered by a power amplifier, the power amplifier to generate a power output sufficient to generate an RF signal through the transmission antenna and sufficient to be directly received at a second satellite;

providing in said second satellite a receive terminal including a receive antenna to receive the RF signal and a low noise amplifier to amplify the RF signal channeled through the receive antenna, said low noise amplifier being fabricated on an Monolithic Microwave Integrated Circuit (MMIC);

cooling the MMIC to a predetermined temperature thereby increasing sensitivity of the low noise amplifier; and responsive to said cooling step, reducing the power output generated by the power amplifier in the first satellite, thereby reducing the overall power requirements of the spaced-based microwave communication system.

2. The method of claim 1, wherein said step of cooling the MMIC further includes the step of cooling the MMIC with a thermoelectric cooler.

3. The method of claim 2, wherein the RF signal is a frequency division multiplexed RF signal, and wherein said step of cooling the MMIC further includes the steps of:

providing the thermoelectric cooler; and coupling the thermoelectric cooler directly to the MMIC, and wherein the method further comprises the steps of:

providing a housing including an upstream end having a first RF connector and a downstream end having a second RF connector;

providing an interconnect substrate carried by said housing in electrical communication with the first RF connector and the second RF connector; and providing the MMIC electrically coupled to said interconnect substrate and located in a hole of said substrate, the hole being intermediate said a RF connector and a second RF connector, the MMIC being substantially planar with the interconnect substrate;

providing the thermoelectric cooler in a recess in said housing, said recess being adjacent to said hole and coupled to a heat spreader.

4. A method of reducing the overall power consumption in a spaced-based microwave communication system, said method comprising the steps of:

providing a transmission terminal in a first satellite including, providing a transmission antenna, and providing a power amplifier to power the transmission antenna, the power amplifier to generate a power output sufficient to generate an RF signal through the transmission antenna and sufficient to be directly received at a second satellite;

providing a receive terminal in said second satellite including, providing a receive antenna to directly receive the RF signal from the first satellite, and providing a low noise amplifier to amplify the RF signal channeled through the receive antenna, said low noise amplifier being fabricated on an Monolithic Microwave Integrated Circuit (MMIC);

cooling the MMIC to a predetermined temperature thereby increasing sensitivity of the low noise amplifier; and responsive to said cooling step, reducing the power output generated by said power amplifier in the first satellite, thereby reducing the overall power requirements of the spaced-based microwave communication system.

5. The method of claim 4, wherein said step of providing a low noise amplifier further includes the steps of:

providing a housing including an upstream end having a first RF connector and a downstream end having a second RF connector;

providing an interconnect substrate carried by said housing in electrical communication with the first RF connector and the second RF connector; and providing the MMIC electrically coupled to said interconnect substrate and located in a hole of said substrate, the hole being intermediate said first RF connector and said second RF connector, the MMIC being substantially planar with the interconnect substrate;

providing the thermoelectric cooler in a recess in said housing, said recess being adjacent to said hole and coupled to a heat spreader.

6. The method of claim 5, wherein the RF signal is a frequency division multiplexed RF signal, and wherein said step of cooling the MMIC further includes the steps of:

providing a thermoelectric cooler; and coupling the thermoelectric cooler directly to the MMIC, the thermoelectric cooler for cooling the MMIC to increase said sensitivity of the low noise amplifier.

7. A spaced-based microwave communication system comprising:

a first satellite transmission terminal including a transmission antenna powered by a power amplifier;

a second satellite receive terminal wherein the power amplifier generates a power output sufficient to generate an RF signal through the transmission antenna and sufficient to be directly received at the second satellite, the second satellite receive terminal including a receive antenna to receive the RF signal and a low noise amplifier to amplify the RF signal channeled through the receive antenna, said low noise amplifier being fabricated on an Monolithic Microwave Integrated Circuit (MMIC); and a thermoelectric cooling device for cooling the MMIC to a predetermined temperature thereby increasing sensitivity of the low noise amplifier, wherein the power output generated by the power amplifier in the first satellite is reduce in response to the cooling thereby reducing the overall power requirements of the spaced-based microwave communication system.

8. The space-based microwave communication system as claimed in claim 7 wherein the RF signal is a frequency division multiplexed RF signal, and wherein said thermoelectric cooling device further comprises:

a housing including an upstream end having a first RF connector and a downstream end having a second RF connector; and an interconnect substrate carried by said housing in electrical communication with the first RF connector and the second RF connector, wherein the MMIC is electrically coupled to said interconnect substrate and located in a hole of said substrate, the hole being intermediate said a RF connector and a second RF connector, the MMIC being substantially planar with the interconnect substrate, and wherein the thermoelectric cooler is located in a recess in said housing, said recess being adjacent to said hole and coupled to a heat spreader.

* * * * *